US010903086B2

(12) United States Patent
Yamasaki et al.

(10) Patent No.: US 10,903,086 B2
(45) Date of Patent: Jan. 26, 2021

(54) TITANIUM SILICIDE REGION FORMING METHOD

(71) Applicant: TOKYO ELECTRON LIMITED, Tokyo (JP)

(72) Inventors: Hideaki Yamasaki, Nirasaki (JP); Kensaku Tanaka, Nirasaki (JP); Yuji Kobayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 186 days.

(21) Appl. No.: 15/955,188

(22) Filed: Apr. 17, 2018

(65) Prior Publication Data
US 2018/0308709 A1   Oct. 25, 2018

(30) Foreign Application Priority Data
Apr. 24, 2017   (JP) ................. 2017-085390

(51) Int. Cl.
*H01L 21/3213* (2006.01)
*H01L 21/3205* (2006.01)
(Continued)

(52) U.S. Cl.
CPC ........ *H01L 21/32053* (2013.01); *C23C 16/00* (2013.01); *C23C 16/0227* (2013.01); *C23C 16/4586* (2013.01); *C23C 16/45512* (2013.01); *C23C 16/45565* (2013.01); *C23C 16/5096* (2013.01); *C23C 16/54* (2013.01); *H01L 21/28518* (2013.01); *H01L 21/28556* (2013.01);
(Continued)

(58) Field of Classification Search
CPC ......... H01L 21/76843; H01L 21/76855; H01L 21/76865; H01L 29/665; H01L 21/28052; H01L 29/4933; H01L 21/823835; H01L 21/76889; H01L 21/28525; H01L 21/28518; H01L 21/76856; H01L 21/76862; H01L 21/76879; H01L 21/32053; H01L 21/32135; H01L 21/32138
See application file for complete search history.

(56) References Cited

U.S. PATENT DOCUMENTS 4,468,308 A  *  8/1984  Scovell ................. C23C 26/00
                                                   204/192.15
4,545,116 A  *  10/1985  Lau ................... H01L 21/28518
                                                   148/DIG. 147
(Continued)

FOREIGN PATENT DOCUMENTS

EP  0 849 377   *  6/1998  ........... H01L 21/321
JP  H10-12569 A    1/1998
(Continued)

*Primary Examiner* — Mary A Wilczewski
(74) *Attorney, Agent, or Firm* — Nath, Goldberg & Meyer; Jerald L. Meyer

(57) ABSTRACT

A titanium silicide region forming method includes: performing a pretreatment to expose a clean surface of a silicon layer of a workpiece; forming a titanium-containing region and a titanium silicide region on the silicon layer after performing the pretreatment; and supplying a fluorine-containing gas to the workpiece including the titanium-containing region and the titanium silicide region so as to selectively etch the titanium-containing region with respect to the titanium silicide region.

8 Claims, 10 Drawing Sheets

(51) Int. Cl.
  *C23C 16/02* (2006.01)
  *C23C 16/00* (2006.01)
  *H01L 21/285* (2006.01)
  *C23C 16/54* (2006.01)
  *C23C 16/455* (2006.01)
  *C23C 16/509* (2006.01)
  *C23C 16/458* (2006.01)
  *H01L 21/67* (2006.01)
  *H01L 21/687* (2006.01)

(52) U.S. Cl.
  CPC .. *H01L 21/32135* (2013.01); *H01L 21/32137* (2013.01); *H01L 21/67167* (2013.01); *H01L 21/68742* (2013.01); *H01L 21/32138* (2013.01)

(56) References Cited

U.S. PATENT DOCUMENTS

| | | | | |
|---|---|---|---|---|
| 4,675,073 A * | 6/1987 | Douglas | H01L 21/3211 | 257/369 |
| 4,804,636 A * | 2/1989 | Groover, III | H01L 21/32053 | 148/DIG. 147 |
| 4,908,331 A * | 3/1990 | Raaijmakers | H01L 21/28518 | 257/E21.165 |
| 4,951,103 A * | 8/1990 | Esquivel | H01L 27/115 | 257/321 |
| 4,957,590 A * | 9/1990 | Douglas | H01L 21/31116 | 204/192.35 |
| 4,962,414 A * | 10/1990 | Liou | H01L 21/76802 | 257/740 |
| 5,164,331 A * | 11/1992 | Lin | C23F 4/00 | 216/75 |
| 5,419,805 A * | 5/1995 | Jolly | H01L 21/32136 | 257/E21.311 |
| 5,565,038 A * | 10/1996 | Ashley | B08B 3/08 | 134/2 |
| 5,565,702 A * | 10/1996 | Tamura | H01L 23/5252 | 257/530 |
| 5,716,494 A * | 2/1998 | Imai | H01L 21/30604 | 257/E21.219 |
| 5,776,830 A * | 7/1998 | Sumi | H01L 21/28518 | 257/E21.165 |
| 5,789,318 A * | 8/1998 | Delfino | H01L 21/28518 | 438/656 |
| 5,856,237 A * | 1/1999 | Ku | C23C 16/42 | 257/E21.165 |
| 5,864,161 A * | 1/1999 | Mitani | H01L 21/02381 | 257/347 |
| 5,895,255 A * | 4/1999 | Tsuchiaki | H01L 21/3081 | 438/427 |
| 5,897,373 A * | 4/1999 | Peng | H01L 21/28518 | 257/E21.165 |
| 5,926,737 A * | 7/1999 | Ameen | C23C 16/14 | 257/E21.165 |
| 5,926,743 A * | 7/1999 | Xi | C23C 16/4405 | 134/1.1 |
| 6,018,185 A * | 1/2000 | Mitani | H01L 21/28518 | 257/374 |
| 6,093,645 A * | 7/2000 | Ameen | H01L 21/76862 | 438/683 |
| 6,156,633 A * | 12/2000 | Pan | H01L 21/28518 | 257/E21.165 |
| 6,159,852 A * | 12/2000 | Nuttall | C23C 16/04 | 257/E21.166 |
| 6,191,463 B1 * | 2/2001 | Mitani | H01L 21/28176 | 257/411 |
| 6,204,170 B1 * | 3/2001 | Taguwa | H01L 21/28518 | 257/E21.165 |
| 6,225,202 B1 * | 5/2001 | Gupta | C23F 4/00 | 257/E21.311 |
| 6,255,179 B1 * | 7/2001 | Cantell | H01L 21/02054 | 257/E21.165 |
| 6,403,473 B1 * | 6/2002 | Schmidbauer | C23C 14/165 | 257/E21.165 |
| 6,518,376 B2 * | 2/2003 | Benham | C08F 10/02 | 526/106 |
| 6,796,314 B1 * | 9/2004 | Graff | B08B 7/00 | 134/1 |
| 7,022,618 B2 * | 4/2006 | Sharan | H01L 21/3065 | 438/706 |
| 7,049,231 B2 * | 5/2006 | Nuttall | C23C 16/04 | 438/674 |
| 7,709,376 B2 * | 5/2010 | Matsuyama | H01L 21/28556 | 257/E21.168 |
| 9,275,834 B1 * | 3/2016 | Park | H01J 37/3244 | |
| 9,287,134 B2 * | 3/2016 | Wang | H01L 21/0337 | |
| 9,472,417 B2 * | 10/2016 | Ingle | H01L 21/02071 | |
| 9,472,456 B2 * | 10/2016 | Thompson | H01L 21/76897 | |
| 10,049,891 B1 * | 8/2018 | Wang | H01L 21/76814 | |
| 10,418,246 B2 * | 9/2019 | Kuratomi | C23C 16/50 | |
| 10,770,300 B2 * | 9/2020 | Kuratomi | H01L 21/32051 | |
| 2001/0045660 A1 * | 11/2001 | Tsubouchi | H01L 21/76841 | 257/761 |
| 2002/0011465 A1 * | 1/2002 | Yamamoto | C04B 41/009 | 216/75 |
| 2002/0029748 A1 * | 3/2002 | Kuwada | C23C 16/45572 | 118/724 |
| 2003/0031794 A1 * | 2/2003 | Tada | H01L 21/76843 | 427/255.391 |
| 2003/0203606 A1 * | 10/2003 | Maekawa | H01L 21/76802 | 438/592 |
| 2004/0082168 A1 * | 4/2004 | Lee | H01L 21/28518 | 438/683 |
| 2004/0137692 A1 * | 7/2004 | Nam | H01L 21/76805 | 438/381 |
| 2004/0232467 A1 * | 11/2004 | Otsuki | C23C 16/45561 | 257/303 |
| 2005/0003600 A1 * | 1/2005 | Kasai | C23C 16/4412 | 438/200 |
| 2009/0071404 A1 * | 3/2009 | Tada | H01L 21/76843 | 118/723 ME |
| 2012/0139015 A1 * | 6/2012 | Yu | H01L 21/76814 | 257/288 |
| 2012/0187460 A1 * | 7/2012 | Lavoie | H01L 21/02211 | 257/288 |
| 2014/0206196 A1 * | 7/2014 | Umezaki | H01L 21/32137 | 438/706 |
| 2014/0353734 A1 * | 12/2014 | Xie | H01L 21/283 | 257/288 |
| 2018/0122647 A1 * | 5/2018 | Kuratomi | H01J 37/32357 | |

FOREIGN PATENT DOCUMENTS

| | | | |
|---|---|---|---|
| JP | H10-209079 A | 8/1998 | |
| JP | 10-308360 A | 11/1998 | |
| JP | 2001-210713 A | 8/2001 | |
| KR | 20000017211 | * 3/2000 | ....... H01L 21/76877 |

* cited by examiner

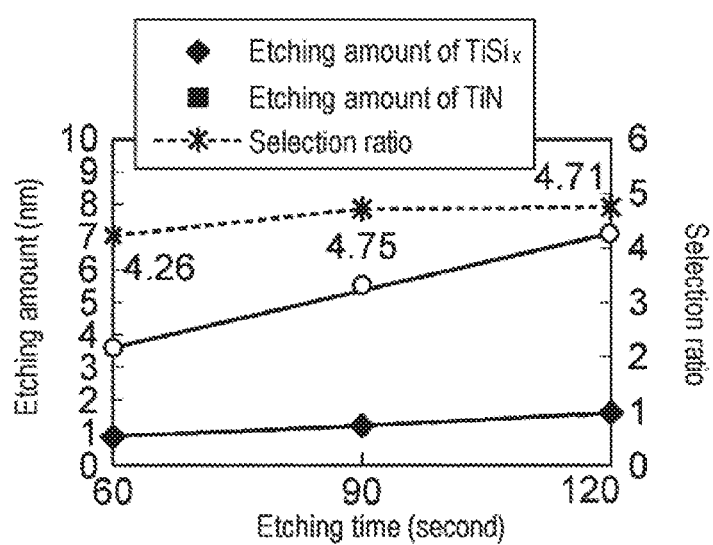

TITANIUM SILICIDE REGION FORMING METHOD

CROSS-REFERENCE TO RELATED APPLICATION

This application is based upon and claims the benefit of priority from Japanese Patent Application No. 2017-085390, filed on Apr. 24, 2017, the entire contents of which are incorporated herein by reference.

TECHNICAL FIELD

The present disclosure relates to a titanium silicide region forming method.

BACKGROUND

In the manufacture of electronic devices such as semiconductor devices or the like, a titanium silicide region may be formed in order to form a contact on a silicon layer.

In a titanium silicide region forming method in a related art, a workpiece includes a silicon substrate and an insulating film formed on the silicon substrate. In the insulating film, an opening for partially exposing the silicon substrate is formed. In the titanium silicide region forming method mentioned above, a titanium film is formed on the insulating film and the silicon substrate, and a titanium silicide region is formed from a region on the silicon substrate in the entire titanium film region. Thereafter, the titanium film is selectively etched with respect to the titanium silicide region. In etching the titanium film, a titanium tetrachloride gas is used.

In the etching of the titanium film using the titanium tetrachloride gas, the etching rate decreases as etching progresses. Therefore, when the titanium tetrachloride gas is used for etching, not only the titanium silicide region but also the titanium film may be left. Therefore, it is necessary to selectively remove the titanium-containing region with respect to the titanium silicide region.

SUMMARY

According to one embodiment of the present disclosure, a titanium silicide region forming method includes: performing a pretreatment to expose a clean surface of a silicon layer of a workpiece; forming a titanium-containing region and a titanium silicide region on the silicon layer after performing the pretreatment; and supplying a fluorine-containing gas to the workpiece including the titanium-containing region and the titanium silicide region so as to selectively etch the titanium-containing region with respect to the titanium silicide region.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 10C is a graph showing the time dependency of the etching of a titanium nitride film and a titanium silicide film performed using a chlorine trifluoride gas.

DETAILED DESCRIPTION

Figure 1:
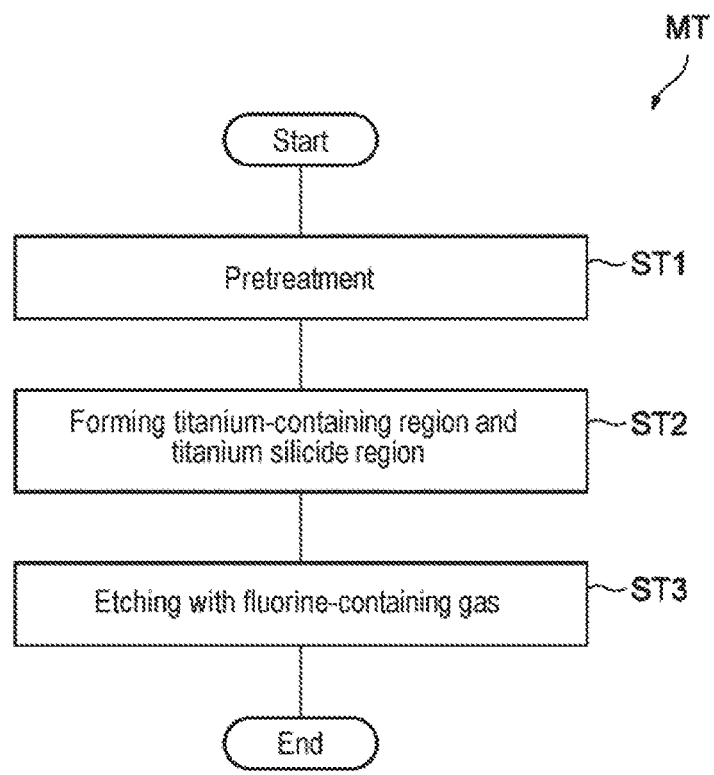
FIG. 1 is a flow chart illustrating a titanium silicide region forming method according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, various embodiments will be described in detail with reference to the drawings. In the drawings, the same or corresponding parts are denoted by the same reference numerals.

Figure 2:
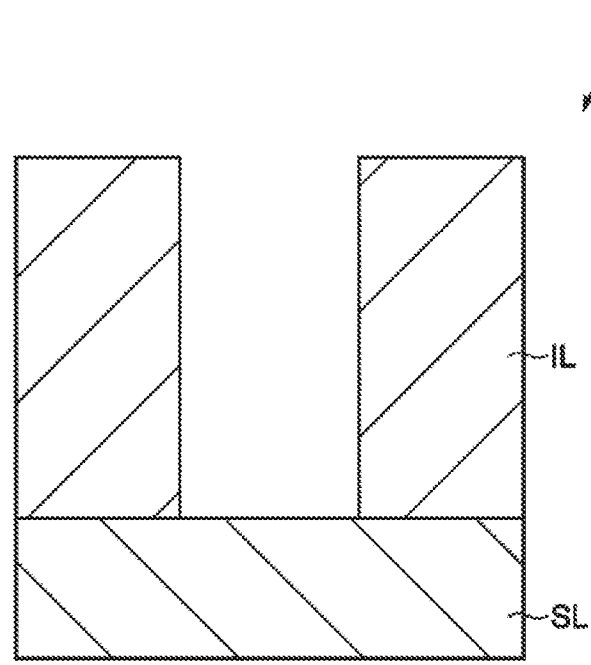
FIG. 2 is a partially enlarged sectional view of an example of a workpiece.

FIG. 1 is a flowchart illustrating a titanium silicide region forming method according to an embodiment. The method MT shown in FIG. 1 is executed to form a titanium silicide region on a workpiece. FIG. 2 is a partially enlarged sectional view of an example of a workpiece. The method MT may be applied to the workpiece W shown in FIG. 2.

As shown in FIG. 2, the workpiece W includes a silicon layer SL and an insulating film IL. The silicon layer SL is formed of silicon. The insulating film IL is formed on the silicon layer SL. The insulating film IL is made of, for example, silicon oxide. An opening is formed in the insulating film IL. The opening of the insulating film IL partially exposes the surface of the silicon layer SL.

Figure 3:
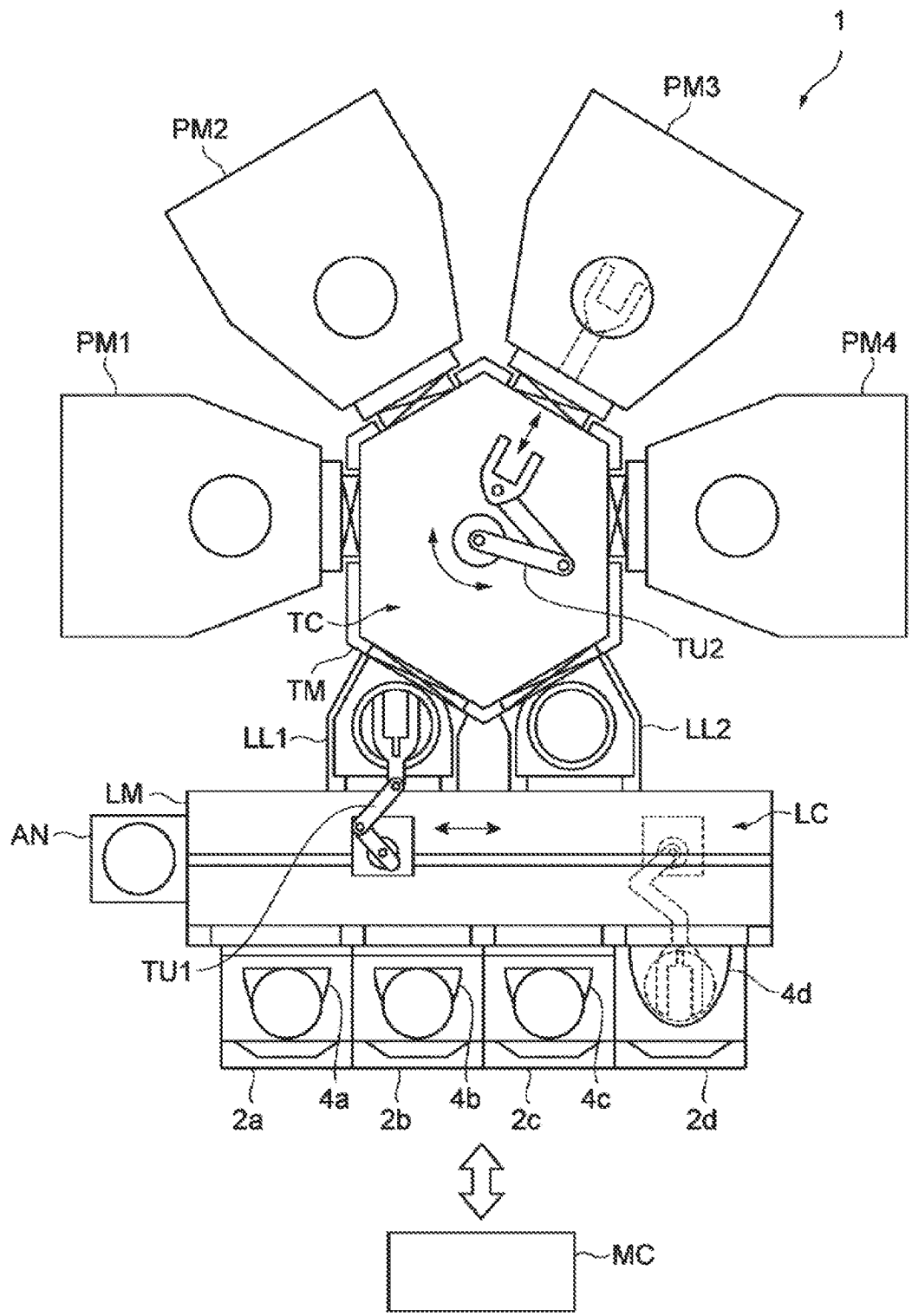
FIG. 3 is a view showing a processing system that can be used in the method shown in FIG. 1

FIG. 3 is a view showing a processing system that can be used in the method shown in FIG. 1. The method MT can be executed using the processing system shown in FIG. 3. The processing system 1 shown in FIG. 3 includes tables 2a, 2b, 2c, and 2d, containers 4a. 4b, 4c, and 4d, a loader module LM, an aligner AN, load lock modules LL1 and LL2, a transfer module TM, and process modules PM1, PM2, PM 3 and PM 4. The number of tables, the number of containers, and the number of load lock modules in the processing system 1 may be an arbitrary number of one or more.

The tables 2a, 2b, 2c, and 2d are arranged along one edge of the loader module LM. The containers 4a, 4b, 4c, and 4d are disposed on the tables 2a, 2b, 2c, and 2d, respectively. The containers 4a, 4b, 4c, and 4d are configured to accommodate the workpiece W therein. Each of the containers 4a, 4b, 4c, and 4d may be a container called an FOUP (Front-Opening Unified Pod).

The loader module LM provides a chamber LC therein. The pressure of the chamber LC is set to an atmospheric pressure. The loader module LM includes a transfer device TU1. The transfer device TU1 is, for example, an articulated robot. The transfer device TU1 is configured to transfer the workpiece W via the chamber LC between each of the containers 4a. 4b, 4c, and 4d and the aligner AN, between the aligner AN and each of the load lock modules LL1 and LL2, and between each of the containers 4a. 4b, 4c, and 4d and each of the load lock modules LL1 and LL2. The aligner AN is connected to the loader module LM. The aligner AN calibrates the position of the workpiece W therein.

The load lock modules LL1 and LL2 are provided between the loader module LM and the transfer module TM. Each of the load lock modules LL1 and LL2 provides a preliminary depressurization chamber. A gate valve is provided between the preliminary depressurization chamber of each of the load lock modules LL1 and LL2 and the chamber LC.

The transfer module TM provides a chamber TC therein. The chamber TC is configured to be capable of being depressurized. A gate valve is provided between the chamber TC and each of the load lock modules LL1 and LL2. The transfer module TM includes a transfer device TU2. The transfer device TU2 is, for example, an articulated robot. The transfer device TU2 is configured to transfer the workpiece W via the chamber TC between each of the load lock modules LL1 and LL2 and each of the process modules PM1, PM2, PM3, and PM4, and between any two process modules among the process modules PM1, PM2, PM3, and PM4.

Each of the process modules PM1, PM2, PM3, and PM4 is a device that executes dedicated substrate processing. The chamber of each of the process modules PM1, PM2, PM3, PM4 are connected to the chamber TC via a gate valve. Step ST1 of the method MT, which will be described later, is executed using the process module PM1 and the process module PM4. In one example, the process module PM1 supplies a mixed gas of a hydrogen fluoride gas and an ammonia gas to a depressurized chamber. As a result, the silicon oxide constituting the oxide film (natural oxide film) on the surface of the silicon layer SL of the workpiece W is transformed into ammonium fluorosilicate. Thereafter, the workpiece W is transferred to the process module PM4. The process module PM4 heats the workpiece W in the depressurized chamber. When the workpiece W is heated, ammonium fluorosilicate is vaporized. The generated gas is exhausted. As a result, the oxide film is removed. Thereafter, the workpiece W is transferred to the process module PM2.

Step ST2 of the method MT, which will be described later, is executed using the process module PM2. The process module PM2 is a film forming apparatus for forming a titanium-containing region and a titanium silicide region. The workpiece W on which the titanium-containing region and the titanium silicide region are formed in the process module PM2 is transferred to the process module PM3. Step ST3 of the method MT, which will be described later, is executed using the process module PM3. The process module PM3 is an etching apparatus for etching the titanium-containing region.

The processing system 1 may further include a control part MC. The control part MC is configured to control the respective parts of the processing system 1 during the execution of the method MT. The control part MC may be a computer device including a processor (for example, a CPU), a memory device such as a memory or the like, and a control signal input/output interface. The memory device stores a control program and a recipe data. As the processor operates according to the control program and the recipe data, control signals are sent to the respective parts of the processing system 1. The method MT can be executed by such an operation of the control part MC.

Figure 4:
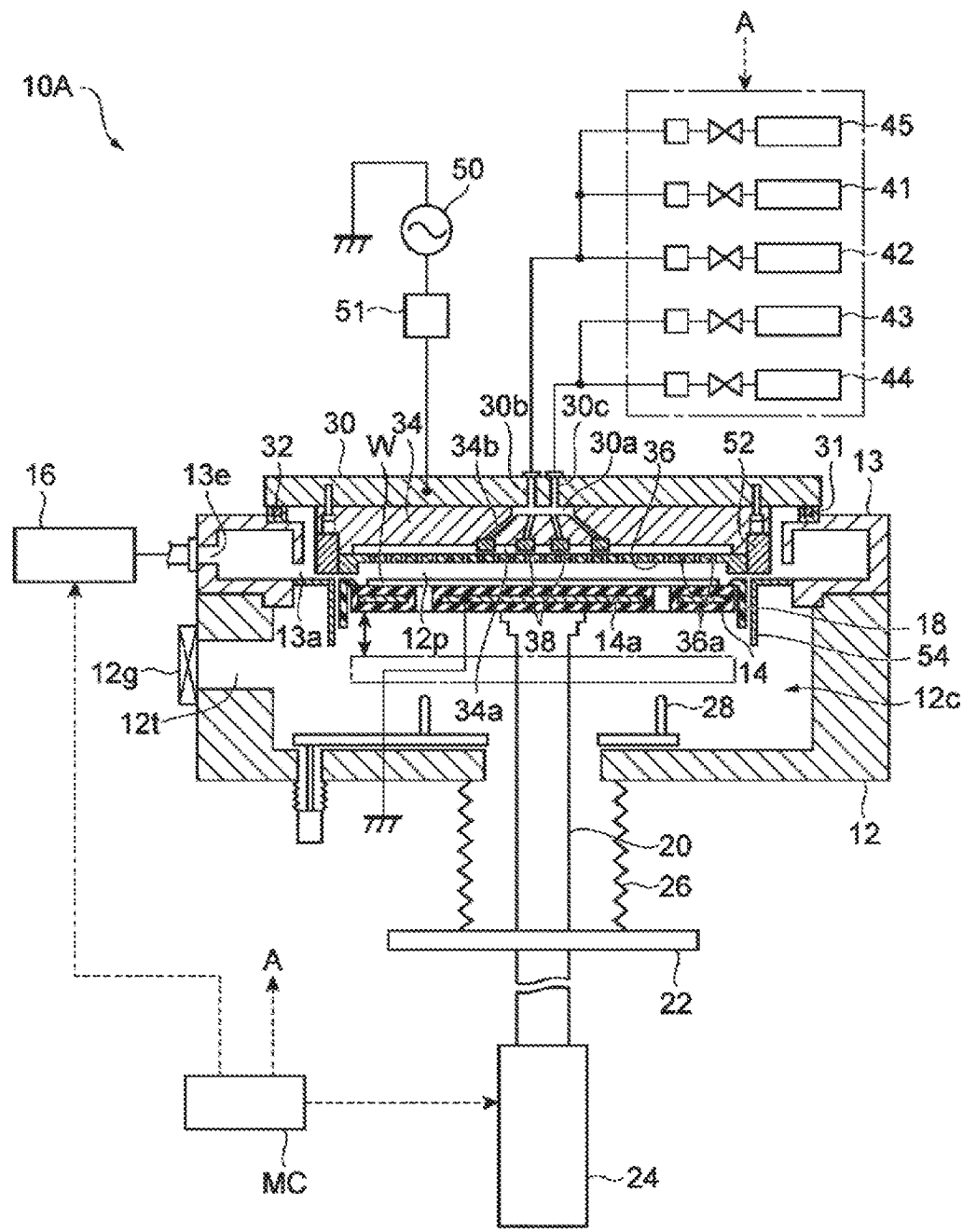
FIG. 4 is a view showing a film forming apparatus that can be used in the processing system of FIG. 3.

FIG. 4 is a view showing a film forming apparatus that can be used in the processing system of FIG. 3. The film forming apparatus 10A shown in FIG. 3 may be employed as the process module PM2. The film forming apparatus 10A includes a chamber body 12. The chamber body 12 has a substantially cylindrical shape. The chamber body 12 provides its internal space as a chamber 12c. The chamber 12c includes a processing space 12p in which the workpiece W is processed. The chamber body 12 is made of, for example, metal. A stage 14 is provided in the chamber 12c. The stage 14 is configured to support the workpiece W. A passage 12t is formed in a side wall of the chamber body 12. The workpiece W passes through the passage 12t when the workpiece W is loaded into the chamber 12c from outside of the chamber 12c and when the workpiece W is unloaded from the chamber 12c to outside of the chamber 12c. On the side wall of the chamber body 12, a gate valve 12g for opening and closing the passage 12t is provided.

On the chamber body 12, an exhaust duct 13 is provided. The exhaust duct 13 is made of metal. The exhaust duct 13 extends in the circumferential direction so as to surround the processing space 12p. A slit-like opening 13a is formed in the inner wall portion of the exhaust duct 13. The gas existing in the processing space 12p flows from the opening 13a into the exhaust duct 13. An exhaust port 13e is formed in the outer wall portion of the exhaust duct 13. An exhaust part 16 is connected to the exhaust port 13e. The exhaust part 16 includes a pressure regulation device such as a pressure regulation valve or the like and a pressure reduction pump such as a vacuum pump or the like. The gas flowing into the exhaust duct 13 is discharged through the exhaust port 13e.

The stage 14 is arranged at a more inner side than the exhaust duct 13 in the chamber 12c. The stage 14 has a substantially disk-like shape, and is made of, for example, ceramics or metal. Inside the stage 14, a heater is installed. As the heater inside the stage 14 generates heat, the workpiece W is heated. In addition, the stage 14 may include an electrostatic chuck to hold the workpiece W.

The stage 14 provides a mounting region on which the workpiece W is mounted. A cover member 18 is attached to the stage 14. The cover member 18 extends so as to cover the region on the outer peripheral side of the mounting region of the stage 14 and the side surface of the stage 14.

A guide ring 54 is provided around the stage 14. The guide ring 54 is made of an insulating material, for example, aluminum oxide. The guide ring 54 has a substantially cylindrical shape. The upper end of the guide ring 54 is formed in a flange shape. The upper end of the guide ring 54 is supported by the exhaust duct 13. A gap is formed between the guide ring 54 and the cover member 18. By this guide ring 54, the flow of gas around the stage 14 is controlled.

The stage 14 is connected to an elevating mechanism 24 via a support member 20 and a support base 22. The support member 20 extends to the outside of the chamber body 12 through an opening formed in the bottom portion of the chamber body 12. One end of the support member 20 is coupled to the stage 14, and the other end of the support member 20 is connected to the elevating mechanism 24. The support base 22 is provided between one end and the other end of the support member 20. A bellows 26 is provided so as to surround the support member 20 between the bottom portion of the chamber body 12 and the support base 22. One end of the bellows 26 is connected to the chamber body 12, and the other end of the bellows 26 is connected to the support base 22. By virtue of the bellows 26, airtightness is secured in the bottom portion of the chamber body 12.

The elevating mechanism 24 raises and lowers the stage 14 between a first position and a second position. When the stage 14 is located at the first position (the position indicated by a one-dot chain line in FIG. 4), the workpiece W is delivered between the stage 14 and the transfer device TU2. When the stage 14 is located at the second position (the position of the stage 14 shown in FIG. 4), the workpiece W mounted on the stage 14 is processed. Below the stage 14, a plurality of support pins 28 is provided. When the support pins 28 protrude from the upper surface of the stage 14 via the through-holes of the stage 14, the workpiece W is separated from the stage 14 and is supported by the support pins 28.

On the upper surface side of the exhaust duct 13, a support plate 30 is provided. The support plate 30 has a substantially disk-like shape and is made of metal. An insulating member 31 having a ring shape is provided between the exhaust duct 13 and the support plate 30. An O-ring 32 is provided between the insulating member 31 and the support plate 30. The airtightness of the chamber 12c is secured by the O-ring 32. Further, the support plate 30 is electrically insulated from the exhaust duct 13 by the insulating member 31. A metal-made top plate 34 is fixed to the lower surface side of the support plate 30.

A concave portion is formed on the lower surface side of the top plate 34. On the lower surface side of the top plate 34, a shower head 36 is provided so as to cover the concave portion of the top plate 34. The shower head 36 is made of metal. The shower head 36 has a substantially disk-like shape. The central region of the shower head 36 provides a generally flat lower surface and faces the mounting region of the stage 14. The peripheral region of the shower head 36 protrudes more downward than the central region thereof.

When the stage 14 is located in the second position, the peripheral region of the shower head 36 faces the cover member 18 via a gap. The space surrounded by the shower head 36 and the stage 14 is the processing space 12p.

The concave portion of the top plate 34 covered with the shower head 36 is a gas diffusion chamber 34a. A large number of gas discharge holes 36a is formed in the shower head 36. The gas supplied to the gas diffusion chamber 34a is discharged from the gas discharge holes 36a into the processing space 12p and is supplied to the workpiece W.

In the gas diffusion chamber 34a, a plurality of gas diffusion portions 38 is provided. For example, the gas diffusion portions 38 are arranged concentrically. Each of the gas diffusion portions 38 has a cylindrical shape with its upper end opened and its lower end closed. A plurality of gas discharge holes are formed in the side wall of each of the gas diffusion portions 38. The gas discharge holes are arranged along the circumferential direction. The upper end opening of each of the gas diffusion portions 38 is connected to one end of a gas supply path 34b formed in the top plate 34.

A diffusion chamber 30a is formed between the upper surface of the top plate 34 and the lower surface of the support plate 30. The other end of the gas supply path 34b is connected to the diffusion chamber 30a. On the support plate 30, a first supply path 30b and a second supply path 30c are formed. One end of the first supply path 30b and one end of the second supply path 30c are connected to the diffusion chamber 30a.

The other end of the first supply path 30b is connected to an inert gas source 41 via a flow rate controller and an opening/closing valve. The inert gas output from the inert gas source 41 may be a rare gas such as an argon gas or the like. The other end of the first supply path 30b is also connected to a hydrogen gas ($H_2$ gas) source 42 via a flow rate controller and an opening/closing valve. The other end of the first supply path 30b is also connected to an ammonia gas ($NH_3$ gas) source 45 via a flow rate controller and an opening/closing valve. The other end of the second supply path 30c is connected to an inert gas source 43 via a flow rate controller and an opening/closing valve. The inert gas output from the inert gas source 43 may be a rare gas such as an argon gas or the like. The other end of the second supply path 30c is also connected to a titanium-containing gas source 44 via a flow rate controller and an opening/closing valve. The titanium-containing gas is, for example, a titanium tetrachloride gas.

A high frequency power source 50 is connected to the support plate 30 via a matcher 51. The high frequency power source 50 is a power source for generating high frequency power (high-frequency electric energy) for plasma generation. The frequency of the high frequency power generated by the high frequency power source 50 is, for example, 450 kHz or 13.56 MHz. The support plate 30, the top plate 34, and the shower head 36 are electrically connected to each other and constitute an upper electrode to which the high frequency power for plasma generation is supplied.

An insulating member 52 is provided around the upper electrode. The insulating member 52 is made of, for example, quartz. The insulating member 52 has a substantially cylindrical shape. A gap is formed between the insulating member 52 and the outer peripheral surface of the upper electrode. The lower end surface of the insulating member 52 is provided at substantially the same level as the lower end surface of the upper electrode (the lower end surface of the peripheral edge region of the shower head 36) in the vertical direction. The insulating member 52 electrically insulates the chamber body 12 and the exhaust duct 13 from the upper electrode.

In the stage 14, a lower electrode 14a is provided. The lower electrode 14a and the upper electrode constitute a parallel plate electrode. In one example, the stage 14 is made of ceramics, and the lower electrode 14a has a substantially disk-like shape and is built in the stage 14. The lower electrode 14a is grounded. Alternatively, the high frequency power source 50 may be connected to the lower electrode 14a via the matcher 51, and the upper electrode may be grounded. Alternatively, a metal-made stage heater may be used so that the entire stage 14 functions as a lower electrode. When the support member 20 is also made of metal, an insulating member may be provided between the support member 20 and the support base 22 to electrically insulate the support member 20 and the support base 22 from each other.

In the film forming apparatus 10A, when high frequency power is supplied to the upper electrode, the gas existing in the processing space 12p is excited by a high frequency electric field formed between the upper electrode and the lower electrode 14a. As a result, a titanium-containing region can be formed on the workpiece W. Further, by heating the workpiece W with the heater of the stage 14, titanium on the silicon layer SL can be transformed into titanium silicide, thereby forming a titanium silicide region.

The film forming apparatus 10A is connected to a control part MC. Each part of the film forming apparatus 10A is controlled by a control signal from the control part MC. This makes it possible to operate each part of the film forming apparatus 10A.

Figure 5:
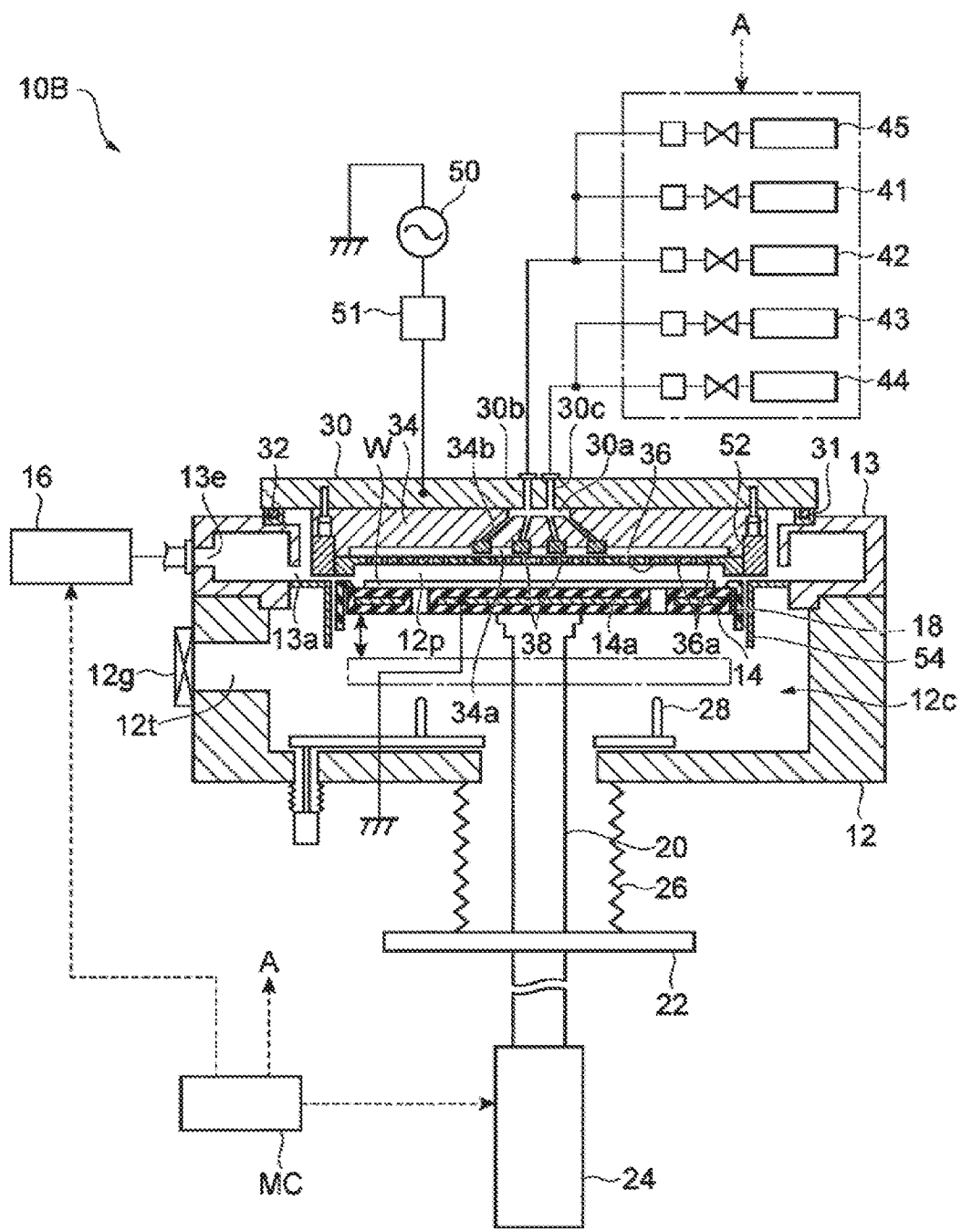
FIG. 5 is a view showing an etching apparatus that can be used in the processing system of FIG. 3.

FIG. 5 is a view showing an etching apparatus that can be used in the processing system of FIG. 3. The etching apparatus 10B illustrated in FIG. 5 may have the same configuration as the film forming apparatus 10A. In the etching apparatus 10B, the source 44 is a fluorine-containing gas source. The fluorine-containing gas is, for example, a chlorine trifluoride gas. The fluorine-containing gas may be a hydrogen fluoride gas or a fluorine gas ($F_2$ gas). Each part of the etching apparatus 10B is controlled by the control part MC. In the etching apparatus 10B, the workpiece W is heated by the heater of the stage 14 in a state in which the workpiece W is mounted on the stage 14. Further, the fluorine-containing gas is supplied to the processing space 12p. Then, the titanium-containing region of the workpiece W is etched by molecules or atoms generated from the fluorine-containing gas.

Figure 6:
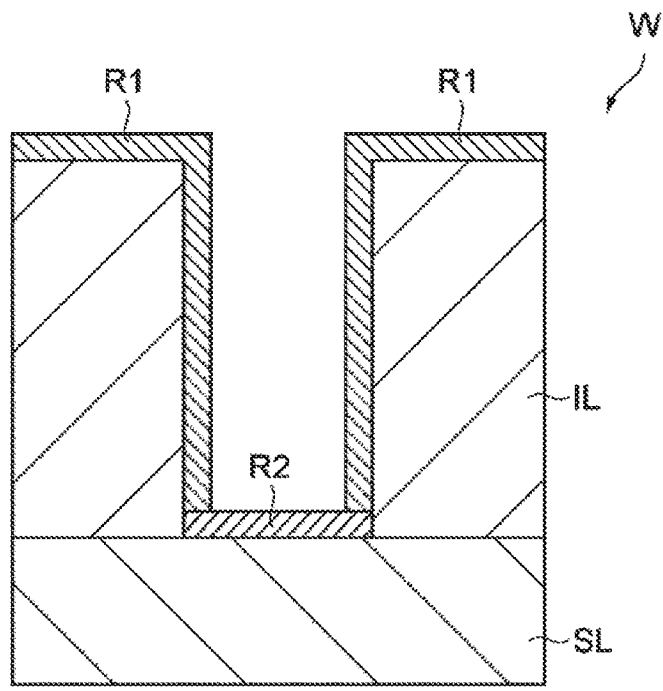
FIG. 6 is a partially enlarged sectional view of a workpiece obtained during execution of the method shown in FIG. 1.
Figure 7:
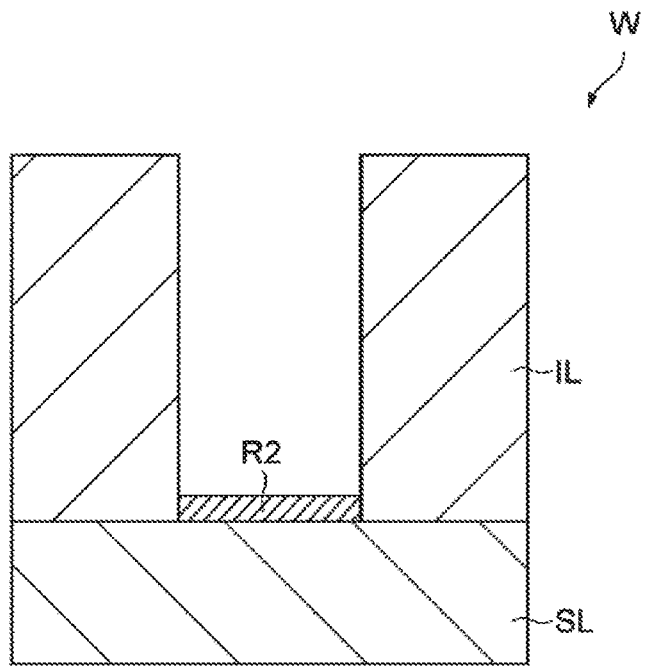
FIG. 7 is a partially enlarged sectional view of a workpiece after executing the method shown in FIG. 1.

Referring again to FIG. 1, the method MT will be described. In the following description, the method MT will be described by taking, as an example, a case where the method MT is applied to the workpiece W shown in FIG. 2 by using the processing system 1 including the film forming apparatus 10A and the etching apparatus 10B. In the following description, reference is made to FIGS. 6 and 7 in addition to FIG. 1. FIG. 6 is a partially enlarged sectional view of the workpiece obtained during the execution of the method shown in FIG. 1. FIG. 7 is a partially enlarged sectional view of the workpiece after execution of the method shown in FIG. 1.

As shown in FIG. 1, in the method MT, step ST1 is first executed. In step ST1, pretreatment is performed on the workpiece W shown in FIG. 2. The pretreatment is performed in order to expose the clean surface of the silicon layer SL of the workpiece W. In the pretreatment, the oxide film (natural oxide film) on the surface of the silicon layer SL of the workpiece W is removed. Specifically, in step ST1, the workpiece W is transferred to the process module PM1. Then, a mixed gas of a hydrogen fluoride gas and an ammonia gas is supplied to the depressurized chamber inside the process module PM1. As a result, the silicon oxide constituting the oxide film on the surface of the silicon layer SL of the workpiece W is transformed into ammonium fluorosilicate. Next, the workpiece W is transferred to the process module PM4. Then, the workpiece W is heated in the depressurized chamber inside the process module PM4. The workpiece W is heated to, for example, a temperature falling within a range of 50 degrees C. to 500 degrees C., alternatively 150 degrees C. to 200 degrees C. Thus, ammonium fluorosilicate is vaporized and generated gas is exhausted. As a result, the oxide film is removed. Thereafter, the workpiece W is transferred to the process module PM2, i.e., the film forming apparatus 10A.

In the subsequent step ST2, a titanium-containing region and a titanium silicide region are formed on the workpiece W to which the pretreatment has been applied. Specifically, step ST2 is executed when the workpiece W is mounted on the stage 14 of the film forming apparatus 10A. In step ST2, the workpiece W is heated by the heater of the stage 14. The workpiece W is heated to a temperature falling within a range of 300 degrees C. to 800 degrees C. For example, the workpiece is heated to a temperature of 400 degrees C. to 500 degrees C. In step ST2, a titanium-containing gas (for example, a titanium tetrachloride gas), a hydrogen gas, and an inert gas (for example, an argon gas) are supplied to the processing space 12p of the film forming apparatus 10A. Then, the high frequency power is applied to the upper electrode of the film forming apparatus 10A. As a result, in step ST2, plasma is generated in the processing space 12p, molecules of the titanium-containing gas are decomposed, and a titanium film is formed on the workpiece W. As shown in FIG. 6, the titanium film forms a titanium-containing region R1 on the insulating film IL. The titanium-containing region R1 is made of titanium. The titanium film is combined with silicon on the silicon layer SL to form a titanium silicide region R2. Incidentally, after the titanium film is formed, a nitrogen-containing gas (for example, an $NH_3$ gas) may be supplied to the processing space 12p so that the surface of the titanium-containing region R1 is nitrided. In this case, the titanium-containing region R1 is nitrided from the surface side and is transformed into a titanium nitride film. The titanium silicide region R2 is a region where the titanium film and silicon are combined with each other. Therefore, the titanium silicide region R2 is hardly transformed. After the execution of step ST2, the workpiece W shown in FIG. 6 is transferred to the process module PM3, i.e., the etching apparatus 10B.

In the subsequent step ST3, the titanium-containing region R1 is selectively etched with respect to the titanium silicide region R2. Step ST3 is executed in a state in which the workpiece W is mounted on the stage 14 of the etching apparatus 10B. In step ST3, the workpiece W is heated by the heater of the stage 14. The workpiece W is heated to a temperature falling within a range of 50 degrees C. to 500 degrees C., alternatively 150 degrees C. to 200 degrees C. In step ST3, a fluorine-containing gas is supplied to the processing space 12p of the etching apparatus 10B. The fluorine-containing gas is, for example, a chlorine trifluoride gas. The fluorine-containing gas may be a hydrogen fluoride gas or a fluorine gas ($F_2$ gas). In step ST3, the flow rate of the chlorine trifluoride gas is set to a flow rate of 10 sccm or less, or 5 sccm or less. In step ST3, the pressure inside the processing space 12p is set to a pressure falling within a range of 0.5 Torr (66.6 Pa) or more and 10 Torr (1330 Pa) or less. In step ST3, in addition to the fluorine-containing gas, a hydrogen gas ($H_2$ gas) and/or an inert gas such as an argon gas may be supplied to the processing space 12p. In step ST3, as shown in FIG. 7, the titanium-containing region R1 is selectively etched by molecules or atoms generated from the fluorine-containing gas.

In the method MT, the fluorine-containing gas is used for etching the titanium-containing region R1. By using the fluorine-containing gas, the titanium-containing region R1 is selectively removed with respect to the titanium silicide region R2. Therefore, it is possible to selectively remove the titanium-containing region R1 with respect to the titanium silicide region R2.

Various modifications may be made without being limited to the embodiments described above. For example, in the above-described embodiments, the titanium-containing region R1 is formed of titanium. However, the method MT may be used to selectively etch a titanium-containing region containing titanium oxide and/or titanium nitride with respect to a titanium silicide region. Further, in step ST3, a hydrogen gas ($H_2$ gas) may be supplied in addition to the fluorine-containing gas. Alternatively, instead of the hydrogen gas, a gas containing hydrogen such as an ammonia gas ($NH_3$ gas) or the like may be supplied together with the fluorine-containing gas.

Hereinafter, various experiments conducted for evaluating the method MT will be described.

First Experiment

Figure 8:
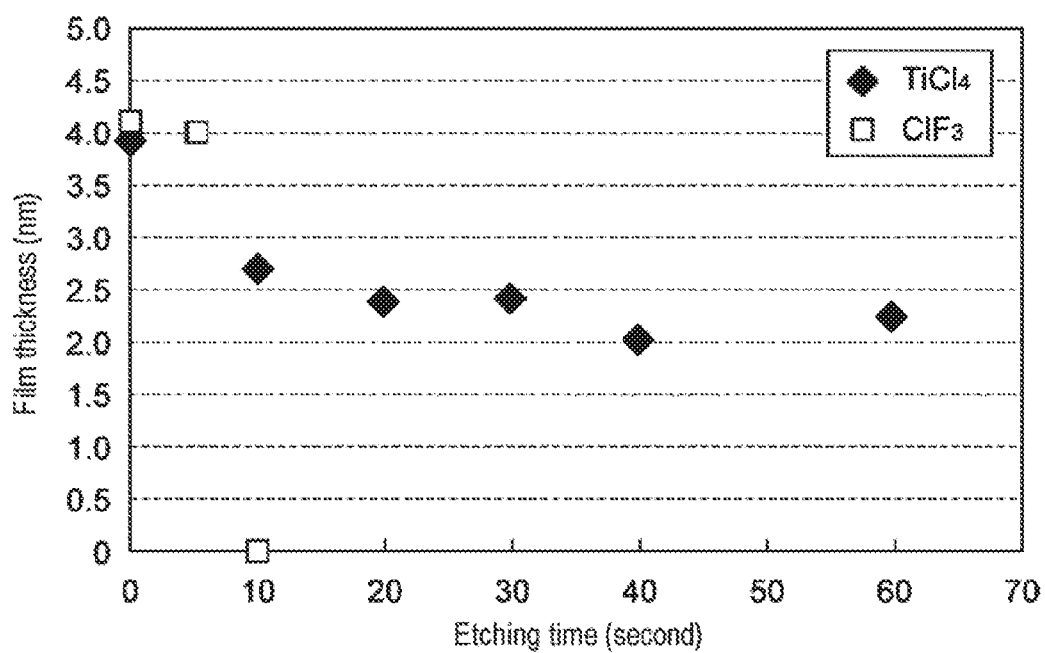
FIG. 8 is a graph showing the time dependency of the film thickness after the etching of a titanium film in the etching performed using a titanium tetrachloride gas and the time dependency of the film thickness after the etching of a titanium film in the etching performed using a chlorine trifluoride gas.

In the first experiment, a titanium film was etched using a chlorine trifluoride ($ClF_3$) gas in the etching apparatus 10B. Further, a titanium film was etched using a titanium tetrachloride ($TiCl_4$) gas in the etching apparatus 10B. Various conditions in the first experiment are shown below.
<Conditions in First Experiment>
When using the $ClF_3$ gas
Pressure of processing space 12p: 1 Torr (133 Pa)
Temperature of workpiece having titanium film: 200 degrees C.
Flow rate of $ClF_3$ gas: 10 sccm
Flow rate of additive gas (Ar gas): 3990 sccm
When using the $TiCl_4$ gas
Pressure of processing space 12p: 3 Torr (400 Pa)
Temperature of workpiece having titanium film: 480 degrees C.
Flow rate of $TiCl_4$ gas: 180 sccm
Flow rate of additive gas (Ar gas): 1,000 sccm In the first experiment, the relationship between the etching time and the film thickness of the titanium film left by etching was investigated. FIG. 8 shows the results. In FIG. 8, the horizontal axis represents the etching time, and the vertical axis represents the film thickness of the titanium film left by etching. As shown in FIG. 8, when the $TiCl_4$ gas was used, if the etching time was 10 seconds or more, the reduction amount of the film thickness of the titanium film was extremely small. That is to say, in the case of using the $TiCl_4$ gas, the thickness of the titanium film was reduced by about 2 nm. However, after the thickness of the titanium film was reduced by about 2 nm, the etching rate of the titanium film was extremely lowered. On the other hand, when the $ClF_3$ gas was used, if the etching time was 10 seconds, the film thickness of the titanium film became zero. That is to say, in the case of using the $ClF_3$ gas, the titanium film was completely removed when the etching time was 10 seconds. Therefore, as a result of the first experiment, it was confirmed that the titanium film can be removed by using the $ClF_3$ gas. The difference in the etching rate occurs presumably because the fluoride of titanium is easier to form than the chloride of titanium and/or because the vaporization rate of the fluoride of titanium is higher than the vaporization rate of the chloride of titanium.

Second Experiment

Figure 9A:
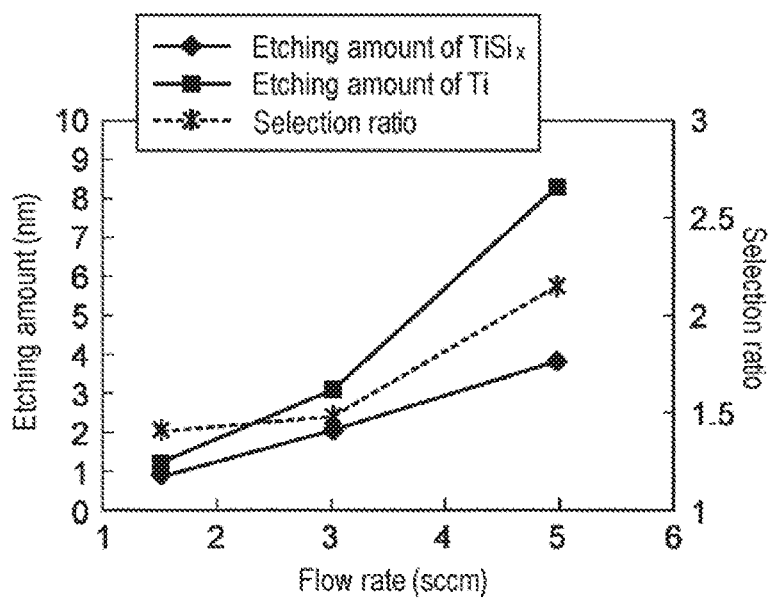
FIG. 9A is a graph showing the flow rate dependency of the etching of a titanium film and a titanium silicide film performed using a chlorine trifluoride gas.
Figure 9B:
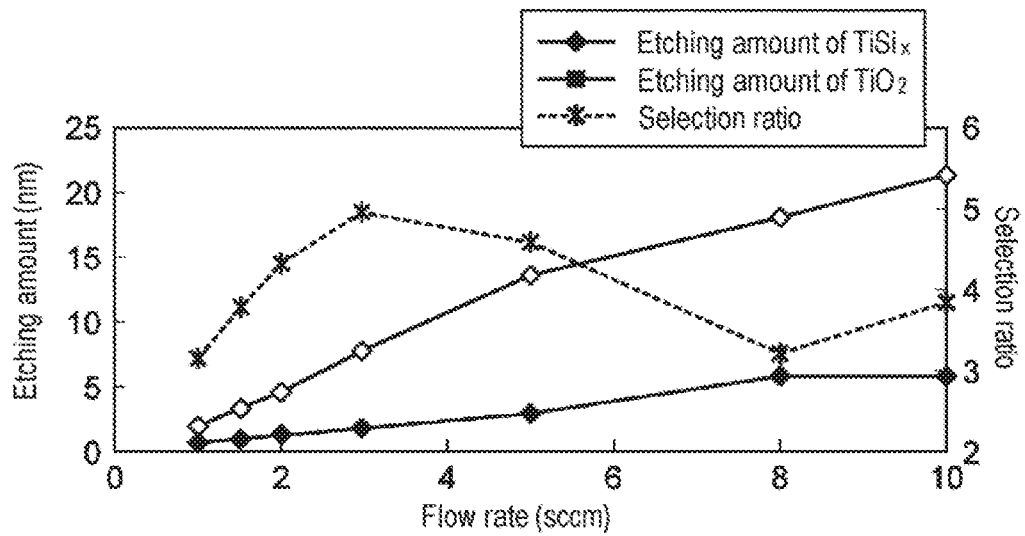
FIG. 9B is a graph showing the flow rate dependency of the etching of a titanium oxide film and a titanium silicide film performed using a chlorine trifluoride gas.

In the second experiment, the dependency of the etching of a titanium (Ti) film, a titanium oxide ($TiO_2$) film, and a titanium silicide ($TiSi_x$) film on the flow rate of a $ClF_3$ gas was investigated. In the second experiment, the titanium (Ti) film, the titanium oxide ($TiO_2$) film, and the titanium silicide ($TiSi_x$) film were etched using the $ClF_3$ gas in the etching apparatus 10B. Various conditions in the second experiment are shown below.
<Conditions in Second Experiment>
Pressure of processing space 12p: 3 Torr (400 Pa)
Temperature of workpiece: 160 degrees C.
Flow rate of additive gas (Ar gas): 12,600 sccm
Etching time: 60 seconds FIG. 9A shows the flow rate dependency of the etching of the Ti film and the TiSix film performed using the $ClF_3$ gas, and FIG. 9B shows the flow rate dependency of the etching of the $TiO_2$ film and the TiSix film performed using the $ClF_3$ gas. In the graphs of FIGS. 9A and 9B, the horizontal axis represents the flow rate of the $ClF_3$ gas, and the vertical axis on the left side shows the etching amount, i.e., the reduction amount of the film thickness of each film. In the graph of FIG. 9A, the vertical axis on the right side represents the selection ratio, i.e., the value obtained by dividing the etching amount of the Ti film by the etching amount of the TiSix film. In the graph of FIG. 9B, the vertical axis on the right side represents the selection ratio, i.e., the value obtained by dividing the etching amount of the $TiO_2$ film by the etching amount of the TiSix film. As shown in FIGS. 9A and 9B, it was confirmed that, if the $ClF_3$ gas is used and the flow rate thereof is 10 sccm or less or 5 sccm or less, it is possible to obtain a selection ratio greater than about 1.5. That is to say, it was confirmed that, by using the $ClF_3$ gas, titanium and titanium oxide can be selectively etched with respect to titanium silicide.

Third Experiment

Figure 10A:
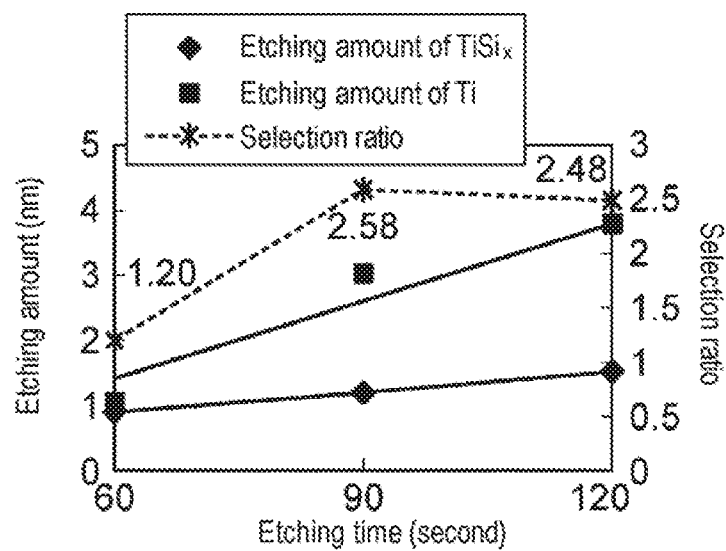
FIG. 10A is a graph showing the time dependency of the etching of a titanium film and a titanium silicide film performed using a chlorine trifluoride gas.
Figure 10B:
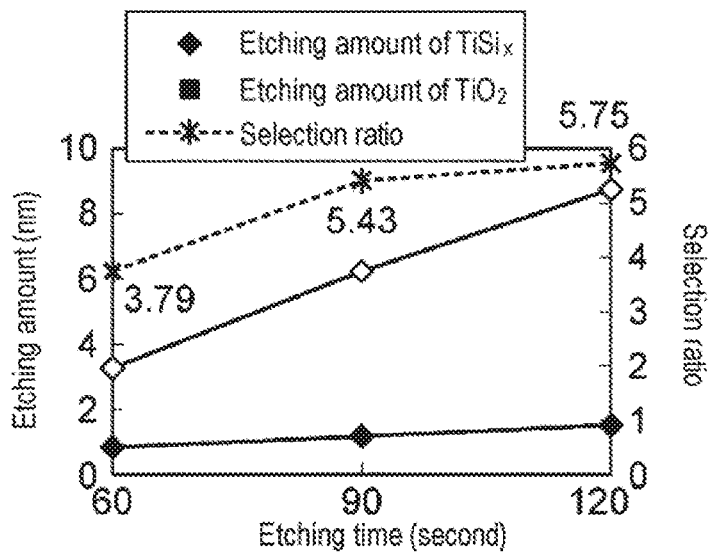
FIG. 10B is a graph showing the time dependency of the etching of a titanium oxide film and a titanium silicide film performed using a chlorine trifluoride gas.

In the third experiment, the time dependency of the etching of a titanium (Ti) film, a titanium oxide ($TiO_2$) film, a titanium nitride (TiN), film and a titanium silicide (TiSix) film performed using a $ClF_3$ gas was investigated. In the third experiment, the titanium (Ti) film, the titanium oxide ($TiO_2$) film, the titanium nitride (TiN) film, and the titanium silicide (TiSix) film were etched using the $ClF_3$ gas in the etching apparatus 10B. Various conditions in the third experiment are shown below.
<Conditions in Third Experiment>
Pressure of processing space 12p: 3 Torr (400 Pa)
Flow rate of $ClF_3$ gas: 1.5 sccm
Temperature of workpiece: 160 degrees C.
Flow rate of additive gas (Ar gas): 12,600 sccm FIG. 10A shows the time dependency of the etching of the Ti film and the TiSix film performed using the $ClF_3$ gas, FIG. 10B shows the time dependency of the etching of the $TiO_2$ film and the TiSix film performed using the $ClF_3$ gas, and FIG. 10C shows the time dependency of the etching of the TiN film and the TiSix film performed using the $ClF_3$ gas. In the graphs of FIGS. 10A, 10B, and 10C, the horizontal axis represents the etching time, and the vertical axis on the left side represents the etching amount, i.e., the reduction amount of the film thickness of each film. In the graph of FIG. 10A, the vertical axis on the right side represents the selection ratio. i.e., the value obtained by dividing the etching amount of the Ti film by the etching amount of the TiSix film. In the graph of FIG. 10B, the vertical axis on the right side represents the selection ratio, i.e., the value obtained by dividing the etching amount of the $TiO_2$ film by the etching amount of the TiSix film. In the graph of FIG. 10C, the vertical axis on the right side represents the selection ratio, i.e., the value obtained by dividing the etching amount of the TiN film by the etching amount of the TiSix film. As shown in FIGS. 10A, 10B, and 10C, it was confirmed that, by using the $ClF_3$ gas, a selection ratio of 1.2 or more can be obtained regardless of the etching time. In addition, it was confirmed that, by using the $ClF_3$ gas, titanium nitride can be selectively etched with respect to titanium silicide.

Fourth Experiment

In the fourth experiment, the temperature dependency (the dependency on the temperature of the workpiece) of the etching of a titanium (Ti) film and a titanium silicide (TiSix) film performed using a $ClF_3$ gas and the pressure dependency (the dependency on the pressure of the processing space 12p) of the etching of a titanium (Ti) film and a titanium silicide (TiSix) film performed using a $ClF_3$ gas were investigated. In the fourth experiment, the titanium (Ti) film and the titanium silicide (TiSix) film were etched using the $ClF_3$ gas in the etching apparatus 10B. Various conditions in the fourth experiment are shown below.

Figure 11A:
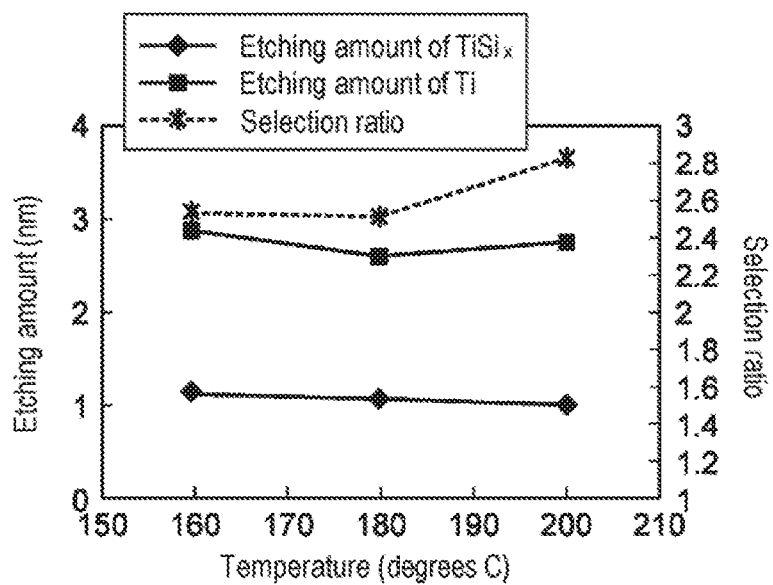
FIG. 11A is a graph showing the temperature dependency of the etching of a titanium film and a titanium silicide film performed using a chlorine trifluoride gas.
Figure 11B:
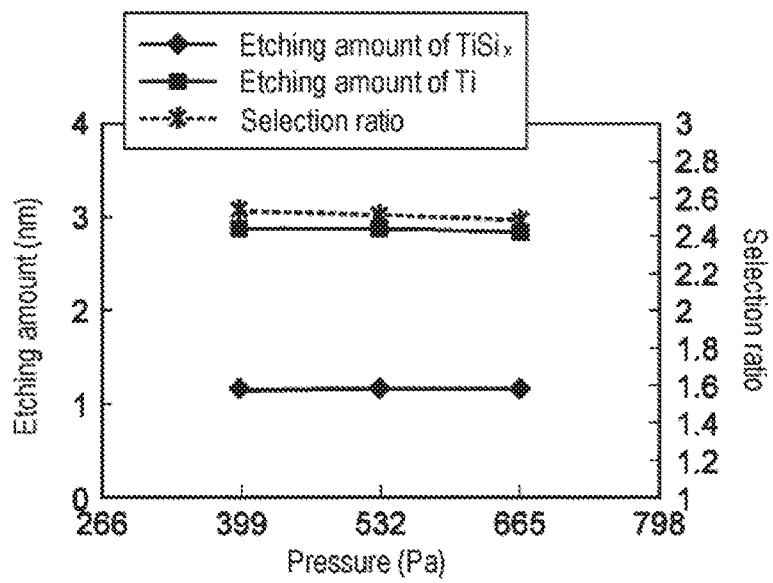
FIG. 11B is a graph showing the pressure dependency of the etching of a titanium film and a titanium silicide film performed using a chlorine trifluoride gas.

<Conditions for Investigation of Temperature Dependency in Fourth Experiment>
Pressure of processing space 12p: 3 Torr (400 Pa)
Flow rate of $ClF_3$ gas: 1.5 sccm
Flow rate of additive gas (Ar gas): 12,600 sccm
Etching time: 75 seconds <Conditions for Investigation of Pressure Dependency in Fourth Experiment>
Flow rate of $ClF_3$ gas: 1.5 sccm
Temperature of workpiece: 160 degrees C.
Flow rate of additive gas (Ar gas): 12,600 sccm
Etching time: 75 seconds FIG. 11A shows the temperature dependency of the etching of the Ti film and the TiSix film performed using the $ClF_3$ gas, and FIG. 11B shows the pressure dependency of the etching of the Ti film and the TiSix film performed using the $ClF_3$ gas. In the graph of FIG. 11A, the horizontal axis represents the temperature of the workpiece. In the graph of FIG. 11B, the horizontal axis represents the pressure inside the processing space 12p. In the graphs of FIGS. 11A and 11B, the vertical axis on the left side represents the etching amount, i.e., the reduction amount of the film thickness of each film. In the graphs of FIGS. 11A and 11B, the vertical axis on the right side represents the selection ratio, i.e., the value obtained by dividing the etching amount of the Ti film by the etching amount of the TiSix film. As shown in FIGS. 11A and 11B, it was confirmed that, when the $ClF_3$ gas is used, it is possible to selectively etch titanium with respect to titanium silicide without substantially depending on the temperature of the workpiece and the pressure of the processing space 12p.

As described above, it is possible to selectively remove the titanium-containing region with respect to the titanium silicide region.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A titanium silicide region forming method, comprising:
performing a pretreatment to expose a clean surface of a silicon layer of a workpiece;
forming a titanium-containing region and a titanium silicide region on the silicon layer after performing the pretreatment; and
selectively etching the titanium-containing region with respect to the titanium silicide region by simultaneously supplying a fluorine-containing gas to an exposed surface of the titanium-containing region and to an exposed surface of the titanium silicide region,
wherein the fluorine-containing gas is a chlorine trifluoride gas, and
wherein a flow rate of the chlorine trifluoride gas is 5 sccm or less.

2. The method of claim 1, wherein the titanium-containing region is formed from at least one of titanium, titanium oxide, and titanium nitride.

3. The method of claim 1, wherein the workpiece includes the silicon layer and an insulating film formed on the silicon layer, the insulating film having an opening through which the silicon layer is partially exposed.

4. The method of claim 3, wherein the insulating film is formed of silicon oxide.

5. The method of claim 3, wherein the titanium-containing region is formed on the insulating film and the titanium silicide region is formed on the exposed clean surface of the silicon layer.

6. The method of claim 1, wherein the act of selectively etching the titanium-containing region further includes supplying a hydrogen-containing gas in addition to the fluorine-containing gas.

7. The method of claim 6, wherein the hydrogen-containing gas is a hydrogen gas.

8. The method of claim 6, wherein the hydrogen-containing gas is an ammonia gas.

* * * * *